(12) United States Patent
Musser et al.

(10) Patent No.: US 9,356,214 B2
(45) Date of Patent: May 31, 2016

(54) COOLING SYSTEM FOR LED DEVICE

(71) Applicant: Flextronics AP, LLC, Broomfield, CO (US)

(72) Inventors: Jordon Musser, Coppell, TX (US); Chris Stratas, Burlingame, CA (US)

(73) Assignee: Flextronics AP, LLC., Broomfield, CO (US)

( * ) Notice: Subject to any disclaimer, the term of this patent is extended or adjusted under 35 U.S.C. 154(b) by 162 days.

(21) Appl. No.: 13/921,067

(22) Filed: Jun. 18, 2013

(65) Prior Publication Data
US 2014/0003068 A1 Jan. 2, 2014

Related U.S. Application Data

(60) Provisional application No. 61/665,179, filed on Jun. 27, 2012, provisional application No. 61/673,660, filed on Jul. 19, 2012.

(51) Int. Cl.
*F21V 29/00* (2015.01)
*H01L 33/64* (2010.01)
*F21K 99/00* (2016.01)
*F21S 8/04* (2006.01)
*F21Y 101/02* (2006.01)

(52) U.S. Cl.
CPC . *H01L 33/64* (2013.01); *F21K 9/00* (2013.01); *F21V 29/006* (2013.01); *F21S 8/04* (2013.01); *F21Y 2101/02* (2013.01)

(58) Field of Classification Search
CPC ..... H01L 23/427; H01L 23/473; H01L 23/42; H01L 23/46; H01L 33/64; F21V 29/006; F21S 8/04; F21S 48/115; F21S 48/326; F21K 9/00; F21K 9/30
USPC ............ 362/373, 294, 547, 249.02, 101, 382, 362/249.01, 264; 165/104.21–104.24, 165/104.33, 65, 66
See application file for complete search history.

(56) References Cited

U.S. PATENT DOCUMENTS

| | | | |
|---|---|---|---|
| 4,729,076 A | 3/1988 | Masami et al. | |
| 4,771,824 A * | 9/1988 | Rojey et al. | ............. 165/104.13 |
| 5,632,551 A | 5/1997 | Roney et al. | |
| RE36,414 E | 11/1999 | Tickner | |
| 6,882,111 B2 | 4/2005 | Kan et al. | |
| 7,210,832 B2 * | 5/2007 | Huang | ......................... 362/547 |
| 7,259,403 B2 | 8/2007 | Shimizu et al. | |
| 7,338,186 B1 * | 3/2008 | Wu | ....................... F21S 2/005 |
| | | | 362/240 |

(Continued)

FOREIGN PATENT DOCUMENTS

DE 102009034841 2/2011

*Primary Examiner* — Anh Mai
*Assistant Examiner* — Arman B Fallahkhair
(74) *Attorney, Agent, or Firm* — Haverstock & Owens LLP

(57) ABSTRACT

A lighting assembly includes a cooling system configured to enable the dissipation of a large amount of energy in the form of heat generated by a light source. Heat is dissipated without heating surrounding components, such as the one or more power supply units and device electronics. The cooling system is configured as a gravity feed system that does not require a powered fluid pump. In some embodiments, the cooling loop is configured as a thermal siphon that uses a boiling fluid to transport heat between the evaporator and the radiators. In some embodiments, the evaporator also functions as a device chassis, which reduces the overall part count. In some embodiments, the light source is a plurality of LEDs.

26 Claims, 5 Drawing Sheets

(56) References Cited

U.S. PATENT DOCUMENTS

| | | |
|---|---|---|
| 7,611,261 B2 | 11/2009 | Richmond et al. |
| 7,682,853 B2 | 3/2010 | Ashida |
| 8,033,716 B1 | 10/2011 | Tandy et al. |
| 8,128,260 B2 | 3/2012 | Ariyoshi |
| 8,227,269 B2 | 7/2012 | Chen et al. |
| 8,228,261 B2 | 7/2012 | Callegari |
| 8,378,559 B2 * | 2/2013 | Shuja et al. ............ 313/34 |
| D687,179 S | 7/2013 | Kim |
| 8,591,051 B2 | 11/2013 | Nakajima et al. |
| 8,661,660 B2 | 3/2014 | Ter-Hovhannissian |
| 2001/0042865 A1 | 11/2001 | Oshio et al. |
| 2004/0062031 A1 | 4/2004 | Pinter |
| 2005/0007769 A1 | 1/2005 | Bonzer et al. |
| 2006/0044806 A1 | 3/2006 | Abramov et al. |
| 2006/0186430 A1 | 8/2006 | Park et al. |
| 2007/0028626 A1 * | 2/2007 | Chen ........................... 62/6 |
| 2008/0048200 A1 | 2/2008 | Mueller et al. |
| 2008/0112176 A1 | 5/2008 | Liesener |
| 2009/0179207 A1 | 7/2009 | Chitnis et al. |
| 2010/0295070 A1 | 11/2010 | Su et al. |
| 2010/0295077 A1 | 11/2010 | Melman |
| 2011/0018017 A1 | 1/2011 | Bierhuizen et al. |
| 2011/0051413 A1 | 3/2011 | Hand |
| 2011/0063836 A1 | 3/2011 | Salm |
| 2011/0085336 A1 | 4/2011 | Blumel et al. |
| 2011/0228517 A1 | 9/2011 | Kawabat et al. |
| 2012/0019137 A1 | 1/2012 | Safarikas et al. |
| 2012/0097985 A1 | 4/2012 | Liu et al. |
| 2012/0120667 A1 | 5/2012 | Schenkl |
| 2012/0205697 A1 | 8/2012 | Kim et al. |
| 2012/0218746 A1 | 8/2012 | Winton |
| 2013/0027906 A1 | 1/2013 | Ueda et al. |
| 2013/0050998 A1 | 2/2013 | Chu et al. |
| 2013/0051001 A1 | 2/2013 | Miskin |
| 2013/0135866 A1 | 5/2013 | Souvay et al. |
| 2013/0155674 A1 | 6/2013 | Park et al. |
| 2013/0182425 A1 | 7/2013 | Seki et al. |
| 2014/0001496 A1 * | 1/2014 | Musser .............. F21K 9/00 257/88 |
| 2014/0003053 A1 * | 1/2014 | Musser .............. F21K 9/00 362/249.03 |
| 2014/0043810 A1 | 2/2014 | Jo et al. |
| 2014/0119032 A1 | 5/2014 | Wimbert et al. |
| 2015/0016123 A1 * | 1/2015 | Musser et al. ............ 362/373 |

\* cited by examiner

COOLING SYSTEM FOR LED DEVICE

RELATED APPLICATIONS

This Patent Application claims priority under 35 U.S.C. 119 (e) of the co-pending U.S. provisional application Ser. No. 61/665,179, filed Jun. 27, 2012, and entitled "LED LIGHTING" and U.S. provisional application Ser. No. 61/673,660, filed Jul. 19, 2012, and entitled "HIGH BAY LED LIGHTING AND HEAT DISSIPATION", both by these same inventors. This application incorporates U.S. provisional application Ser. No. 61/665,179 and U.S. provisional application Ser. No. 61/673,660 in their entireties by reference.

FIELD OF THE INVENTION

The present invention is generally directed to the field of light emitting diode (LED) lighting. More specifically, the present invention is directed to a cooling system for a LED device.

BACKGROUND OF THE INVENTION

High bay lighting applications are those light structures designed for use in buildings with high ceilings, or "high bays" such as warehouses, manufacturing facilities, or the like where the ceilings can be 30-40 feet high. High bay facilities typically mount lighting devices at or near the ceiling. At such heights, lighting devices used in high bay facilities require increased illumination output compared to lighting solutions used in standard offices or homes that have 8-10 feet ceilings. High bay lighting devices are typically designed to operate at a few hundred watts, up to about 400 watts. With that much power, a lot of heat is generated, which needs to be dissipated. Conventional techniques for dissipating heat at these levels use costly extruded heat sinks and forced air blown over the extruded heat sinks. However, in high bay applications, mounting of large heat sinks and fans for providing forced air is problematic, and placing fans at such elevated positions may result in unacceptable noise levels.

SUMMARY OF THE INVENTION

A lighting assembly includes a cooling system configured to enable the dissipation of a large amount of energy in the form of heat generated by a light source. Heat is dissipated without heating surrounding components, such as the one or more power supply units and device electronics. The cooling system is configured as a gravity feed system that does not require a powered fluid pump. In some embodiments, the cooling loop is configured as a thermal siphon that uses a boiling fluid to transport heat between the evaporator and the radiators. In some embodiments, the evaporator also functions as a device chassis, which reduces the overall part count. In some embodiments, the light source is a plurality of LEDs.

In an aspect, a lighting assembly for cooling a light source is disclosed. The lighting assembly includes a light source, an evaporator and one or more cooling loops. The evaporator is thermally coupled to at least a portion of the light source. The evaporator includes a reservoir and a fluid within the reservoir. The evaporator is configured such that at least a portion of the fluid is vaporized by heat transferred from the light source. The one or more cooling loops are coupled to the evaporator. Each cooling loop includes a transfer pipe coupled to the evaporator, a radiator coupled to the transfer pipe, and a return pipe coupled to the radiator and to the evaporator. The radiator is configured to receive vapor from the evaporator via the transfer pipe and to condense the vapor. The radiator and the return pipe are configured to gravity feed fluid to the evaporator.

In some embodiments, the radiator includes a first end coupled to the transfer pipe and a second end, and the radiator is aligned along a non-horizontal plane with the first end positioned higher than the second end. In some embodiments, the return pipe includes a first end coupled to the second end of the radiator and a second end coupled to the evaporator, the return pipe is configured and aligned having the first end of the return pipe positioned higher than the second end of the return pipe. In some embodiments, the lighting assembly also includes a plurality of transfer pipes coupled to the evaporator and a plurality of radiators coupled to the plurality of transfer pipes, wherein each radiator includes the first end and the second end and at least one of the plurality of transfer pipes is coupled to the first end of one of the plurality of radiators. In some embodiments, the transfer pipe has a first portion coupled to the evaporator and aligned substantially vertically from the evaporator and a second portion angled from the first portion and coupled to the radiator. In some embodiments, the second portion is angled at 30 to 60 degrees with respect to the first portion. In some embodiments, the radiator is a finned radiator. In some embodiments, the transfer pipe is a finned pipe. In some embodiments, the fluid is a fluid mixture having at least a first fluid and a second fluid having a higher boiling temperature than the first fluid, wherein the first fluid is the portion of the fluid vaporized by heat transferred from the light source. In some embodiments, the evaporator and the fluid mixture are configured such that when the portion of the fluid is vaporized by heat transferred from the light source a boiling fluid is formed, and the evaporator and the transfer pipe are configured such that the boiling fluid is siphoned from the evaporator to the radiator. In some embodiments, the evaporator has an upper spherical portion. In some embodiments, the light source is a plurality of light emitting diodes. In some embodiments, the plurality of light emitting diodes generate greater than or equal to 100 W. In some embodiments, the lighting assembly further includes a plurality of transfer pipes and a plurality of return pipes coupled to the evaporator, a plurality of radiators wherein each radiator includes a first end and a second end, an input fluid header commonly coupled to the first end of each radiator, and an output fluid header commonly coupled to the second end of each radiator, further wherein each transfer pipe is coupled to the input fluid header and each return pipe is coupled to the output fluid header.

In another aspect, another lighting assembly for cooling a light source is disclosed. The lighting assembly includes a light source, an evaporator, a transfer pipe, a radiator and a return pipe. The evaporator is thermally coupled to at least a portion of the light source, and the evaporator includes a reservoir and a fluid within the reservoir. The evaporator is configured such that at least a portion of the fluid is vaporized by heat transferred from the light source. The transfer pipe is coupled to the evaporator such that vapor formed in the evaporator rises through the transfer pipe. The radiator is coupled to the transfer pipe. The radiator includes a first end coupled to the transfer pipe and a second end, and the radiator is aligned along a non-horizontal plane with the first end positioned higher than the second end. The radiator is configured such that vapor received from the transfer pipe is condensed to fluid and the fluid is gravity fed to the second end. The return pipe is coupled to the radiator. The return pipe includes a first end coupled to the second end of the radiator and a second end coupled to the evaporator. The return pipe is configured and aligned having the first end of the return pipe positioned higher than the second end of the return pipe such that fluid output from the second end of the radiator is gravity fed to the evaporator.

BRIEF DESCRIPTION OF THE DRAWINGS

Several example embodiments are described with reference to the drawings, wherein like components are provided with like reference numerals. The example embodiments are intended to illustrate, but not to limit, the invention. The drawings include the following figures.

DETAILED DESCRIPTION OF THE EMBODIMENTS

Embodiments of the present application are directed to a lighting assembly. Those of ordinary skill in the art will realize that the following detailed description of the lighting assembly is illustrative only and is not intended to be in any way limiting. Other embodiments of the lighting assembly will readily suggest themselves to such skilled persons having the benefit of this disclosure.

Reference will now be made in detail to implementations of the lighting assembly as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 1:
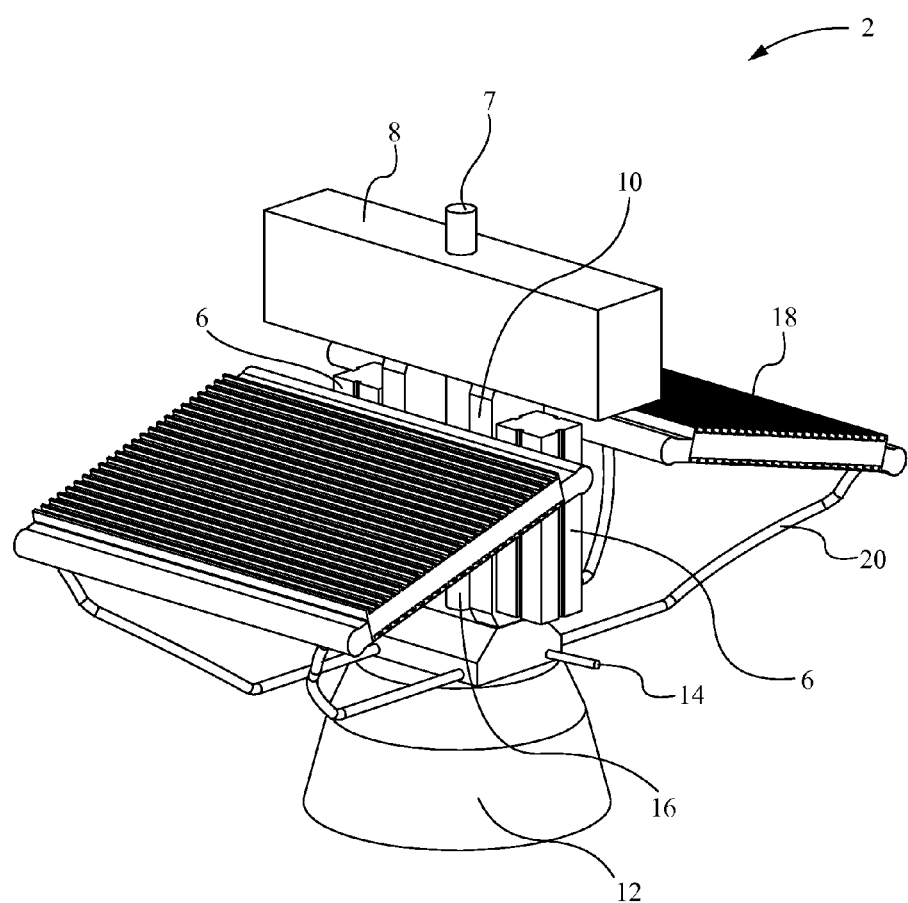
FIG. 1 illustrates a perspective view of a lighting assembly according to an embodiment.
Figure 2:
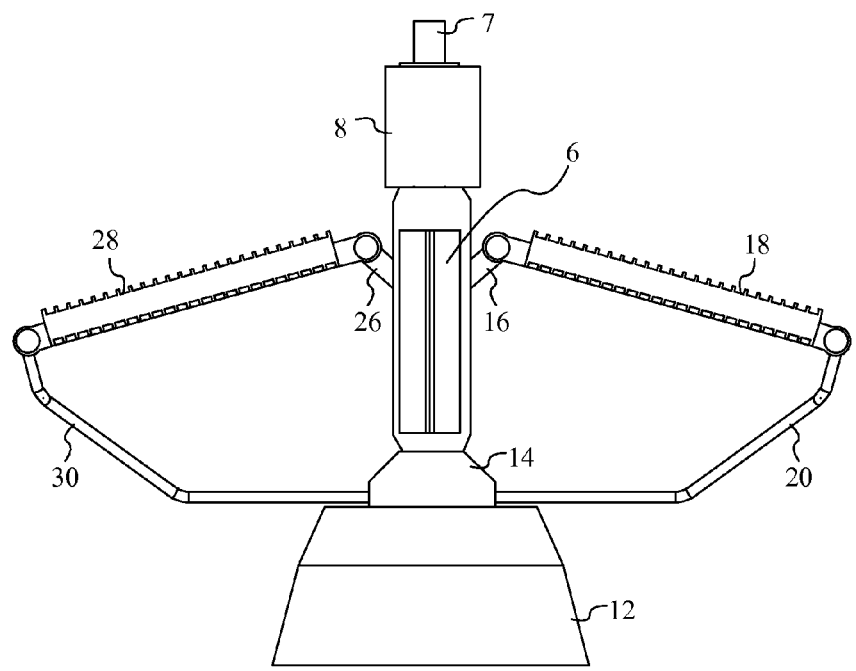
FIG. 2 illustrates a side view of the lighting assembly of FIG. 1.

FIG. 1 illustrates a perspective view of a lighting assembly according to an embodiment. The lighting assembly includes a light source, a cooling system, one or more power supply units, device electronics, and a mounting structure. The cooling system includes one or more cooling loops, each cooling loop including an evaporator, a vertically ascending pipe, a radiator and a return pipe. The exemplary cooling system shown in FIG. 1 includes two cooling loops, each cooling loop shares a common evaporator 14. FIG. 2 illustrates a side view of the lighting assembly 2 of FIG. 1. A first cooling loop includes the evaporator 14, a vertically ascending pipe 16, a radiator 18, and a return pipe 20. A second cooling loop includes the evaporator 14, a vertically ascending pipe 26, a radiator 28 and a return pipe 30. FIGS. 1 and 2 also show an optional reflector 12. The light source is positioned within the reflector 12. The first cooling loop and the second cooling loop are each closed loop. Although two closed loop cooling systems are shown in the lighting assembly of FIGS. 1 and 2, it is understood that a lighting assembly can be configured to include a single closed loop cooling system or three or more closed loop cooling systems. The lighting assembly includes a mounting structure 10 coupled to the evaporator 14 and to device electronics 8. In this exemplary configuration, the lighting assembly includes two power supplies 6. The power supplies 6 can be mounted to the mounting structure 10, a housing of the device electronics 8, the evaporator 14, the pipes 16 and 26 or some combination thereof. An external mounting base 7 is coupled to the housing of the device electronics 8. The external mounting base 7 is used to mount the lighting assembly. In some embodiments, the external mounting base 7 is configured to receive a conduit, which in turn is mounted to an external support, such as a ceiling.

The cooling system is configured to enable the dissipation of a large amount of energy in the form of heat without heating surrounding components, such as the one or more power supply units and device electronics. In some embodiments, the cooling loop is configured as a thermal siphon that uses a boiling fluid to transport heat between the evaporator and the radiators. In some embodiments, the evaporator also functions as a device chassis, which reduces the overall part count. In some embodiments, the light source is a plurality of LEDs. LEDs have a well defined thermal performance and therefore operate properly within a defined temperature range. The cooling system is designed to maintain the LED temperatures within the defined temperature range. The one or more power supply units are arranged such that heat generated by the one or more power supply units does not negatively impact the thermal performance of the LED light source.

The evaporator 14 is a fluid-based heat exchanger that conceptually functions as a boiling unit. In some embodiments, the evaporator 14 includes a fluid reservoir that is filled, or partially filled, with a fluid or fluid mixture, herein referred to collectively as a fluid. The evaporator 14 is thermally coupled to the light source such that heat generated by the light source is transferred to the fluid within the evaporator 14. The heat causes fluid in the evaporator 14 to evaporate. The resulting vapor rises through the vertically ascending pipes 16, 26 to the radiators 18, 28. In some embodiments, each pipe 16, 26 includes a first portion that extends straight up from the evaporator 14 and a second portion that bends at an angle from completely vertical, but not horizontal, which is coupled to the radiator 18, 28. In some embodiments, the angle of the second portion is 30 to 60 degrees relative to vertical or the first portion. The portion of pipes 16, 26 shown in FIG. 2 is the second, angled portion. It is understood that the pipes 16, 26 can be alternatively shaped so as to provide an upward path from the evaporator 14 to the radiator 18, 28. In some embodiments, the pipes 16, 20 are configured with fins, and the pipe with fins is made of thermally conductive materials. Heat from the rising vapor can be shed during transport through the pipes 16, 26. In some embodiments, the pipes 16, 26 are configured having an oval cross-section to accommodate the internal pressure.

The radiator 18 is aligned at a decline, or downward angle relative to horizontal, such that one end is higher than the other end. The pipe 16 is coupled to a top portion of the radiator 18 and the return pipe 20 is coupled to a bottom portion of the radiator 18. In some embodiments, the pipe 16 is coupled to an end of the top portion of the radiator 18. In some embodiments, the return pipe 20 is coupled to an end of the bottom portion of the radiator 18. Vapor entering the radiator 18 from the pipe 16 condenses and the liquid flows downward through the radiator 18 to the return pipe 20. Due to the declining orientation of the radiator 18, liquid within the radiator is gravity fed toward the bottom end and to the return pipe 20. The return pipe 20 is aligned at a decline such that one end is higher than the other end such that liquid received from the radiator 18 is gravity fed to the evaporator 14.

The second cooling loop is configured similarly as the first cooling loop. The radiator 28 is aligned at a decline, or downward angle relative to horizontal, such that one end is higher than the other end. The pipe 26 is coupled to a top portion of the radiator 28 and the return pipe 30 is coupled to a bottom portion of the radiator 28. In some embodiments, the pipe 26 is coupled to an end of the top portion of the radiator 28. In some embodiments, the return pipe 30 is coupled to an end of the bottom portion of the radiator 28. Vapor entering the radiator 28 from the pipe 16 condenses and the liquid flows downward through the radiator 28 to the return pipe 30. Due to the declining orientation of the radiator 28, liquid within the radiator is gravity fed toward the bottom end and to the return pipe 30. The return pipe 30 is aligned at a decline such that one end is higher than the other end such that liquid received from the radiator 28 is gravity fed to the evaporator 14.

The cooling loops are described above has having separate pipes 16 and 26 that couple the evaporator to the radiators 18 and 28, respectively. Alternatively, the pipes 16 and 26 can include a common portion that splits for coupling to the radiators 18 and 28. For example, a single vertically ascending pipe can be coupled to the evaporator 14, and at a top portion of the pipe, the pipe branches, such as into two branches, each branch bends at an angle from completely vertical, but not horizontal. One or more branches are coupled to the radiator 18 and one or more branches are coupled to the radiator 28. Still alternatively, multiple separate pipes can be coupled between the evaporator 14 and a single radiator. For example, two or more pipes, each pipe similar to the pipe 16, can be coupled between the evaporator 14 and the radiator 18. As shown in FIG. 1, each radiator 18 and 28 includes an input header coupled to the pipe 16 and 26, respectively. The input header laterally distributes the vapor received from the pipe. The radiator can also include one or more fluid conduits coupled to the input header and fins coupled to the fluid conduits. The fluid conduits can be arranged laterally and/or layered to form a vertical stack of fluid conduits, each layer separated by fins. The radiator can also include an output header coupled to the one or more fluid conduits. The output header is coupled to the return pipe. In general, the radiators are designed to dissipate the heat to the atmosphere using convection cooling without the need for fans blowing over the radiators.

In some embodiments, the fluid is a fluid mixture consisting of at least two different types of fluids that each evaporate at a different temperature. The thermal characteristics of the cooling system and fluid mixture are configured such that the heat supplied to the fluid within the evaporator is sufficient to evaporate one of the fluids, but insufficient to evaporate the second fluid. The evaporated fluid forms vapor bubbles within the remaining non-evaporated fluid mixture. In this manner, heat transferred to the fluid mixture results in a boiling fluid, a portion of which is a vapor and another portion of which is a liquid. The configuration of the fluid mixture and the vertically ascending pipes enables a pumping means whereby the boiling fluid, including the vapor and liquid forms of fluid mixture, rises from the evaporator 14, through the pipes 16 and 26, to the radiators 18 and 28. The vapor bubbles within the boiling fluid are used to siphon non-evaporated fluid up the pipes 16 and 26 and into the radiators 18 and 28. In this manner, a pumping means is integral to the cooling loop without including a discrete pumping component such as a powered pump. An example of such a pumping means is a bubble pump found in U.S. Patent Application Publication No. 2007/0273024, which is hereby incorporated in its entirety be reference. Although the boiling fluid includes a non-evaporated liquid component, this liquid component has been heated and as such the circulating liquid provides additional thermal transport from the evaporator to the radiator. In the case where the pipes 16 and 26 are finned pipes, heat from the rising boiling fluid can be shed during transport through the pipes 16 and 26.

Figure 6:
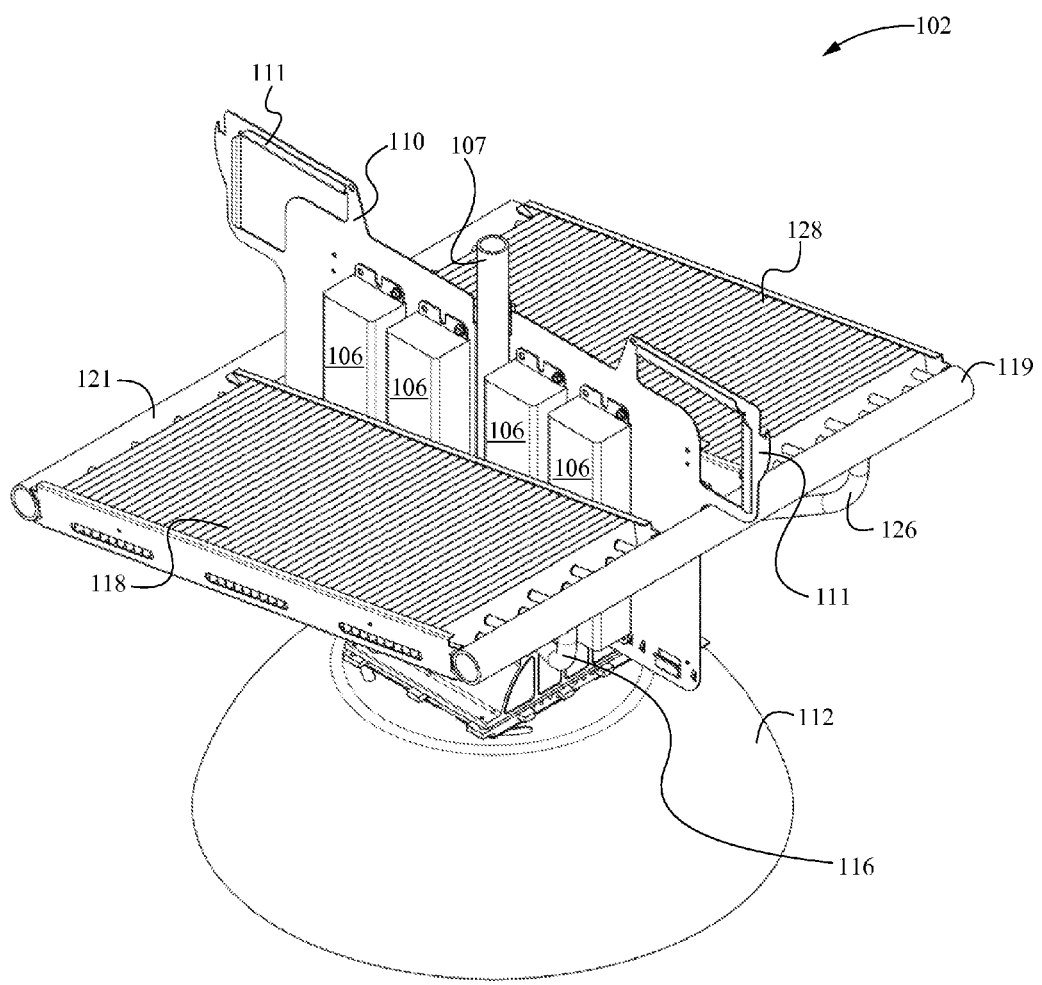
FIG. 6 illustrates a perspective view of a lighting assembly according to another embodiment.
Figure 7:
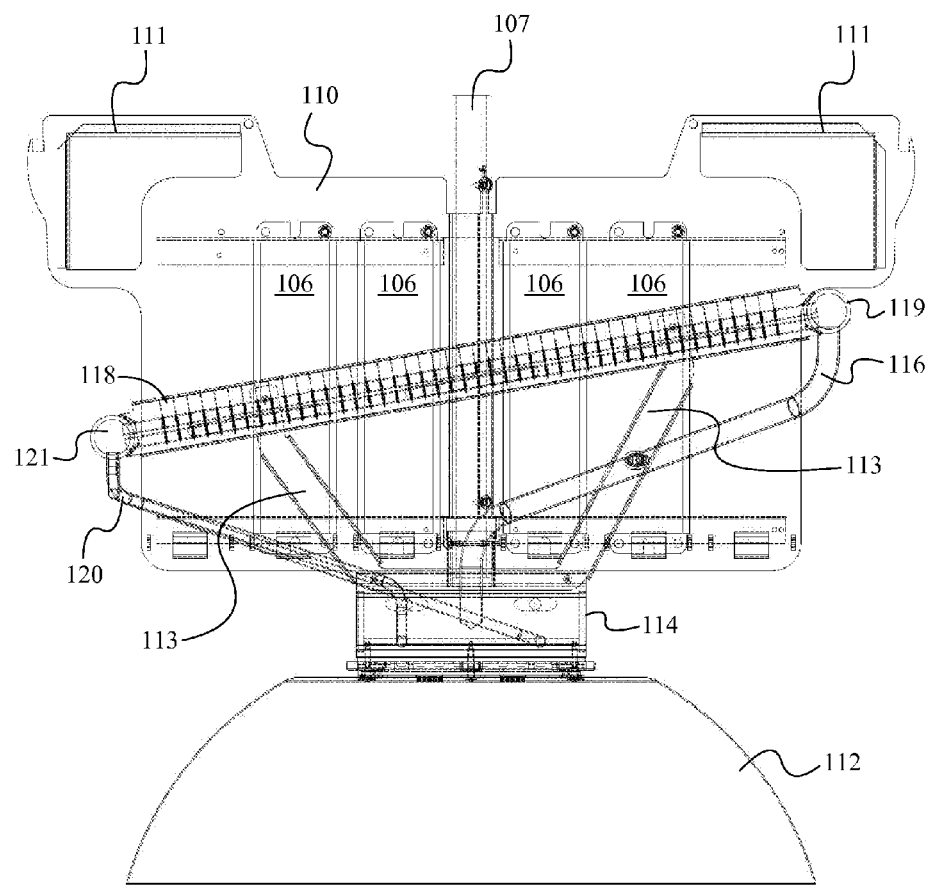
FIG. 7 illustrates a side view of the lighting assembly of FIG. 6.

Alternative configurations of the lighting assembly are also contemplated. FIG. 6 illustrates a perspective view of a lighting assembly according to another embodiment. The lighting assembly includes a light source, a cooling system, one or more power supply units, and a mounting structure. The cooling system includes one or more cooling loops, each cooling loop including an evaporator, a vertically ascending pipe, a radiator and a return pipe. The lighting assembly of FIG. 6 functions similarly as the lighting assembly of FIG. 1 to provide cooling for the light source. The exemplary cooling system shown in FIG. 6 includes two cooling loops, each cooling loop shares a common evaporator 114. FIG. 7 illustrates a side view of the lighting assembly 102 of FIG. 6. A first cooling loop includes the evaporator 114, a vertically ascending pipe 116, a radiator 118, and a return pipe 120. A second cooling loop includes the evaporator 114, a vertically ascending pipe 126, a radiator 128 and another return pipe (not shown). FIGS. 6 and 7 also show an optional reflector 112. The light source is positioned within the reflector 112. The first cooling loop and the second cooling loop are each closed loop. Although two closed loop cooling systems are shown in the lighting assembly of FIGS. 6 and 7, it is understood that a lighting assembly can be configured to include a single closed loop cooling system or three or more closed loop cooling systems.

As shown in FIG. 6, the radiator 118 and the radiator 128 are each coupled to an input header 119 and to an output header 121. In this manner, a single condensing unit is formed having two separate radiator portions coupled via common input and output headers. In the exemplary configuration shown in FIG. 6, separation of the radiators 118 and 128 forms a pathway therebetween within which accessory elements can be positioned. The vertically ascending pipes 116 and 126 are each coupled at one end to the evaporator 114 and at the other end to the input header 119. The return pipe 120 and the other return pipe (not shown) are each coupled at one end to the output header 121 and at the other end to the evaporator 114. The input header 119 laterally distributes the vapor received from the vertically ascending pipes 116 and 126. The radiators 118 and 128 can also include one or more fluid conduits coupled to the input header 119 and to the output header 121, and fins coupled to the fluid conduits. The fluid conduits can be arranged laterally and/or layered to form a vertical stack of fluid conduits, each layer separated by fins. The output header 121 collects the condensed liquid from the radiators 118 and 128.

The lighting assembly includes a mounting structure 110 coupled to the evaporator 114 and positioned in the pathway between the radiators 118 and 128. The mounting structure 110 includes handles 111 for carrying the lighting assembly. In this exemplary configuration, the lighting assembly includes four power supplies 106. The power supplies 106 can be mounted to the mounting structure 110, as shown, the evaporator 114, the vertically ascending pipes 116 and 126 or some combination thereof. An external mounting base 107 is coupled to the mounting structure 110 and/or to the evaporator 114. Bracing elements 113 provide additional support and couple the radiators 118 and 128 to the mounting structure 110, the external mounting base 107, the evaporator 114 or some combination thereof. The external mounting base 107 is used to mount the lighting assembly. In some embodiments, the external mounting base 107 is configured to receive a conduit, which in turn is mounted to an external support, such as a ceiling.

In the configuration shown in FIGS. 6 and 7, a separate device electronics and housing, such as device electronics 8 in FIGS. 1 and 2, is not included. In the configuration shown in FIGS. 6 and 7, device electronics are included as part of a light source assembly, such as the light source 36 shown in FIG. 3 and described below. It is understood that device electronics and housing such as the device electronics 8 in FIGS. 1 and 2 can be added to the lighting assembly 102, such as mounted to the mounting structure 110 and/or to the external mounting base 107.

Figure 3:
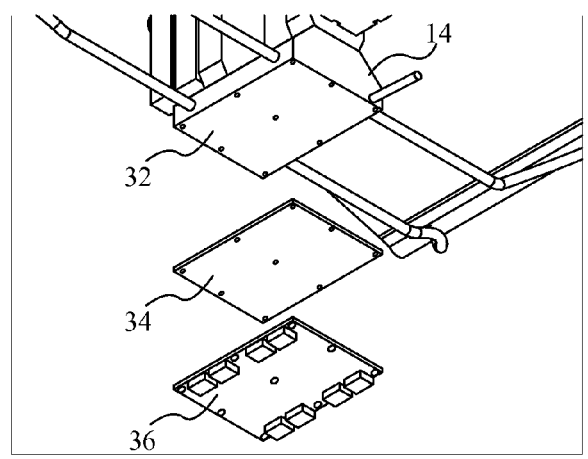
FIG. 3 illustrates a bottom perspective exploded view of the evaporator disassembled from an exemplary light source according to an embodiment.

As described above, the evaporator is configured to transfer heat from a light source coupled to the evaporator to fluid within the evaporator. FIG. 3 illustrates a bottom perspective exploded view of the evaporator 14 disassembled from an exemplary light source 36 according to an embodiment. The evaporator 14 includes a thermal exchange surface 32. As shown in FIG. 3, the thermal exchange surface 32 is a rectangular, planar surface. Alternatively, the surface can be shaped other than a rectangle. Preferably, the shape of the thermal exchange surface matches that of a corresponding thermal exchange surface of the light source. The thermal exchange surface 32 is made of a thermally conductive material, which can be the same or different than the material used to make the remainder of the evaporator. The light source 36 is thermally coupled to the thermal exchange surface 32 via a thermal interface material 34. In some embodiments, the light source 36 is a plurality of LEDs mounted to a printed circuit board. In some embodiments, the printed circuit board is modified for enhanced rigidity. Such a modification is found in the co-pending U.S. patent application Ser. No. 13/921, 044, filed Jun. 18, 2013, and entitled "Relampable LED structure", which is hereby incorporated in its entirety be reference. The light source 36 is mounted to the evaporator 14 using any conventional mounting means including, but not limited to, screws, clamps, and/or brackets.

In some embodiments, the thermal exchanging surface of the evaporator is a non-planar surface. In this alternative configuration, a contour of the thermal exchanging surface is configured to match that of the corresponding thermal exchange surface of the light source. In some embodiments, the light source is configured with a plurality of planar surfaces angled relative to each other. In an exemplary configuration, the light source is a multi-facet light source where each facet is a planar surface having a plurality of LEDs. Such a multi-facet light source is described in the co-pending U.S. patent application Ser. No. 13/921,028, filed Jun. 18, 2013, and entitled "Multi-Facet Light Engine", which is hereby incorporated in its entirety be reference.

Figure 4:
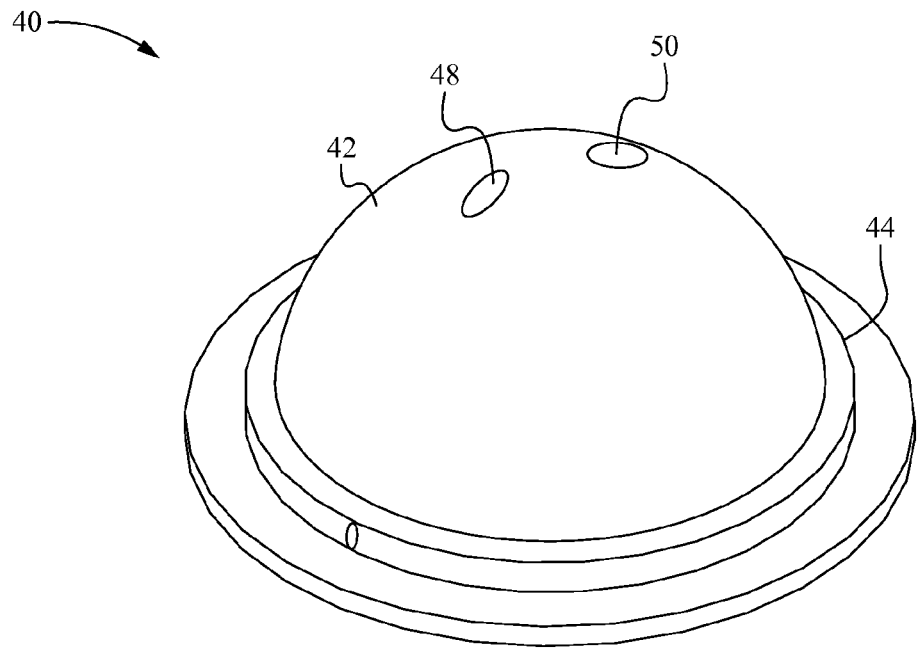
FIG. 4 illustrates a top down perspective view of an exemplary evaporator having a hemispherical configuration according to an embodiment.
Figure 5:
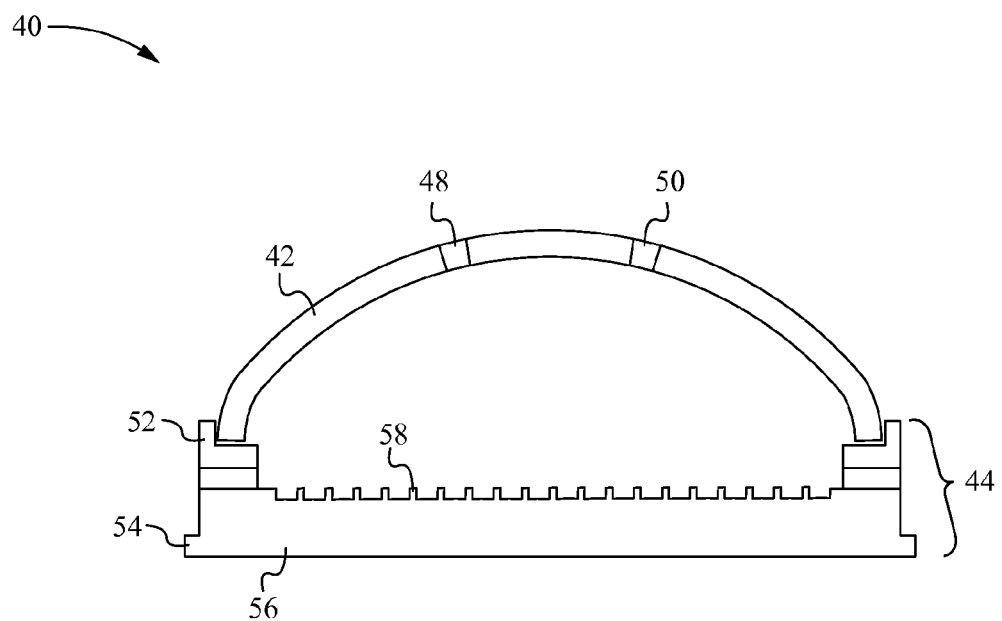
FIG. 5 illustrates a cut out side view of the evaporator of FIG. 4.

As shown in FIGS. 1-3, the evaporator 14 has planar surfaces as in a rectangle or other trapezoidal configuration. Alternatively, the evaporator is configured as a hemispherical evaporator. A hemispherical design mimics the geometry of a pressure vessel with its spherical based shape. Such an evaporator configuration provides significantly improved hoop strength. In some embodiments, the bottom side of the evaporator remains planar in order to interface with a planar light source. In other embodiments, the bottom side is contoured to match some or all of a non-planar thermal exchange surface of the light source. Regardless of the bottom side configuration, at least an upper portion of the evaporator can have a hemispherical configuration. FIG. 4 illustrates a top down perspective view of an exemplary evaporator 40 having a hemispherical configuration according to an embodiment. FIG. 5 illustrates a cut out side view of the evaporator 40 of FIG. 4. The evaporator 40 includes an upper spherical casing 42 coupled to a lower base 44. The upper spherical casing 42 includes one or more openings . IN the exemplary configuration shown in FIG. 4 there are two openings 48 and 50. Each opening is coupled to a vertically ascending pipe. For example, the opening 48 is coupled to the vertically ascending pipe 26 (FIG. 2) and the opening 50 is coupled to the vertically ascending pipe 16 (FIG. 2). The lower base 44 includes a support portion 52 configured to receive the upper spherical casing 42. The lower base 44 also includes a thermal interface plate 54. The thermal interface plate 54 includes an outer surface 56 and an inner surface 58. The outer surface 56 is thermally coupled to the light source. In some embodiments, the outer surface 56 is planer, as shown in FIG. 5. In other embodiments, the outer surface is non-planar and is configured to match some or all of a surface contour of the light source. In some embodiments, the lower base 44 has a circular configuration, as shown in FIG. 4. The lower base 44 can also include additional threaded attachments for the light source, such as an external ring when the lower base has a circular shape. In other embodiments, the lower base is alternatively shaped. The inner surface 58 is configured to promote nucleate boiling of the fluid. In some embodiments, the inner surface 58 has an arrangement of fins and/or divots. In some embodiments, the inner surface 58 includes a specialized surface finish that promotes nucleate boiling.

In some embodiments, the upper spherical casing 42 and the lower base 44 are designed with an interface that allows them to be made with different processes to optimize costs. The separation of the upper spherical casing and the lower base allows the upper portion to be cast, for example, while the lower base is machined, for example, to achieve higher precise and more optimal heat transfer.

In an exemplary application, the lighting assembly is designed for high bay lighting, such as 40-50 feet high ceilings. In such an application, the lighting assembly generates 100-400 watts. In some applications, the lighting assembly generates more than 400 watts. In general, the lighting assembly is useful for those applications requiring lighting solutions with higher wattages than those found in typical office environments having 8-10 feet high ceilings.

The present application has been described in terms of specific embodiments incorporating details to facilitate the understanding of the principles of construction and operation of the lighting assembly. Many of the components shown and described in the various figures can be interchanged to achieve the results necessary, and this description should be read to encompass such interchange as well. As such, references herein to specific embodiments and details thereof are not intended to limit the scope of the claims appended hereto. It will be apparent to those skilled in the art that modifications can be made to the embodiments chosen for illustration without departing from the spirit and scope of the application.

What is claimed is:

1. A lighting assembly for cooling a light source, the lighting assembly comprising:
   a. a light source;
   b. an evaporator thermally coupled to at least a portion of the light source, wherein the evaporator comprises a reservoir having a walled structure for containing a fluid within the reservoir, wherein the walled structure comprises an upper spherical portion that forms a ceiling wall of the reservoir, the evaporator is configured such that at least a portion of the fluid is vaporized by heat transferred from the light source; and
   c. one or more cooling loops coupled to the evaporator, wherein each cooling loop comprises a transfer pipe coupled to the evaporator, a radiator coupled to the transfer pipe, and a return pipe coupled to the radiator and to the evaporator, further wherein the radiator is configured to receive vapor from the evaporator via the transfer pipe and to condense the vapor, and the radiator and the return pipe are configured to gravity feed the fluid to the evaporator.

2. The lighting assembly of claim 1 wherein the radiator includes a first end coupled to the transfer pipe and a second end, and the radiator is aligned along a non-horizontal plane with the first end positioned higher than the second end.

3. The lighting assembly of claim 2 wherein the return pipe includes a first end coupled to the second end of the radiator and a second end coupled to the evaporator, the return pipe is configured and aligned having the first end of the return pipe positioned higher than the second end of the return pipe.

4. The lighting assembly of claim 2 further comprising a plurality of transfer pipes coupled to the evaporator and a plurality of radiators coupled to the plurality of transfer pipes, wherein each radiator includes the first end and the second end and at least one of the plurality of transfer pipes is coupled to the first end of one of the plurality of radiators.

5. The lighting assembly of claim 1 wherein the transfer pipe comprises a first portion coupled to the evaporator and aligned substantially vertically from the evaporator and a second portion angled from the first portion and coupled to the radiator.

6. The lighting assembly of claim 5 wherein the second portion is angled at 30 to 60 degrees with respect to the first portion.

7. The lighting assembly of claim 1 wherein the radiator comprises a finned radiator.

8. The lighting assembly of claim 7 wherein the evaporator and the fluid mixture are configured such that when the portion of the fluid is vaporized by heat transferred from the light source a boiling fluid is formed, further wherein the evaporator and the transfer pipe are configured such that the boiling fluid is siphoned from the evaporator to the radiator.

9. The lighting assembly of claim 1 wherein the transfer pipe comprises a finned pipe.

10. The lighting assembly of claim 1 wherein the fluid comprises a fluid mixture having at least a first fluid and a second fluid having a higher boiling temperature than the first fluid, wherein the first fluid comprises the portion of the fluid vaporized by heat transferred from the light source.

11. The lighting assembly of claim 1 wherein the light source comprises a plurality of light emitting diodes.

12. The lighting assembly of claim 1 wherein the plurality of light emitting diodes generate greater than or equal to 100W.

13. The lighting assembly of claim 1 further comprising a plurality of transfer pipes and a plurality of return pipes coupled to the evaporator, a plurality of radiators wherein each radiator includes a first end and a second end, an input fluid header commonly coupled to the first end of each radiator, and an output fluid header commonly coupled to the second end of each radiator, further wherein each transfer pipe is coupled to the input fluid header and each return pipe is coupled to the output fluid header.

14. The lighting assembly of claim 1 wherein the evaporator is a single chamber formed by the walled structure.

15. A lighting assembly for cooling a light source, the lighting assembly comprising:
   a. a light source;
   b. an evaporator thermally coupled to at least a portion of the light source, wherein the evaporator comprises a reservoir having a walled structure for containing a fluid within the reservoir, wherein the walled structure comprises an upper spherical portion that forms a ceiling wall of the reservoir, the evaporator is configured such that at least a portion of the fluid is vaporized by heat transferred from the light source;
   c. a transfer pipe coupled to the evaporator such that vapor formed in the evaporator rises through the transfer pipe;
   d. a radiator coupled to the transfer pipe, wherein the radiator includes a first end coupled to the transfer pipe and a second end, and the radiator is aligned along a non-horizontal plane with the first end positioned higher than the second end, further wherein the radiator is configured such that vapor received from the transfer pipe is condensed to fluid and the fluid is gravity fed to the second end; and
   e. a return pipe coupled to the radiator, wherein the return pipe includes a first end coupled to the second end of the radiator and a second end coupled to the evaporator, the return pipe is configured and aligned having the first end of the return pipe positioned higher than the second end of the return pipe such that fluid output from the second end of the radiator is gravity fed to the evaporator.

16. The lighting assembly of claim 15 wherein the transfer pipe comprises a first portion coupled to the evaporator and aligned substantially vertically from the evaporator and a second portion angled from the first portion and coupled to the radiator.

17. The lighting assembly of claim 16 wherein the second portion is angled at 30 to 60 degrees with respect to the first portion.

18. The lighting assembly of claim 15 wherein the fluid comprises a fluid mixture having at least a first fluid and a second fluid having a higher boiling temperature than the first fluid, wherein the first fluid comprises the portion of the fluid vaporized by heat transferred from the light source.

19. The lighting assembly of claim 18 wherein the evaporator and the fluid mixture are configured such that when the portion of the fluid is vaporized by heat transferred from the light source a boiling fluid is formed, further wherein the evaporator and the transfer pipe are configured such that the boiling fluid is siphoned from the evaporator to the radiator.

20. The lighting assembly of claim 15 further comprising a plurality of transfer pipes coupled to the evaporator and a plurality of radiators coupled to the plurality of transfer pipes, wherein each radiator includes the first end and the second end and at least one of the plurality of transfer pipes is coupled to the first end of one of the plurality of radiators.

21. The lighting assembly of claim 15 wherein the radiator comprises a finned radiator.

22. The lighting assembly of claim 15 wherein the transfer pipe comprises a finned pipe.

23. The lighting assembly of claim 15 wherein the light source comprises a plurality of light emitting diodes.

24. The lighting assembly of claim 15 wherein the plurality of light emitting diodes generate greater than or equal to 100W.

25. The lighting assembly of claim 15 further comprising a plurality of transfer pipes and a plurality of return pipes coupled to the evaporator, a plurality of radiators wherein each radiator includes a first end and a second end, an input fluid header commonly coupled to the first end of each radiator, and an output fluid header commonly coupled to the second end of each radiator, further wherein each transfer pipe is coupled to the input fluid header and each return pipe is coupled to the output fluid header.

26. The lighting assembly of claim 15 wherein the evaporator is a single chamber formed by the walled structure.

* * * * *